US006917889B2

(12) United States Patent
Ward et al.

(10) Patent No.: US 6,917,889 B2
(45) Date of Patent: Jul. 12, 2005

(54) METHOD AND APPARATUS FOR VISUALLY TIME-CORRELATING WAVEFORM MEASUREMENTS TO A SOURCE WAVEFORM

(75) Inventors: Benjamin A. Ward, Portland, OR (US); John J. Pickerd, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/376,108

(22) Filed: Feb. 26, 2003

(65) Prior Publication Data

US 2003/0163266 A1 Aug. 28, 2003

Related U.S. Application Data

(60) Provisional application No. 60/360,194, filed on Feb. 26, 2002.

(51) Int. Cl.[7] ............................ G01R 13/02; G06F 15/00
(52) U.S. Cl. ............................ 702/67; 702/68; 702/187
(58) Field of Search ................................ 702/67, 66, 68, 702/71, 187

(56) References Cited

U.S. PATENT DOCUMENTS 6,195,617 B1   2/2001   Miller 6,311,138 B2   10/2001  Miller
2003/0229473 A1 * 12/2003 Gomes et al. ............... 702/187

OTHER PUBLICATIONS

U.S. Appl. No. 60/346,091, filed Dec. 31, 2001.*
Tektronix Products Catalog, Copyright 1991, Signal Conditioners, New TVC 501; p. 235.
Tektronix Test and Measurement Products Catalog, Copyright 1993, Signal Conditioners TVC 501, AM 503S, AM 503A, A6302; p. 350.

* cited by examiner

*Primary Examiner*—Michael Nghiem
*Assistant Examiner*—Meagan S Walling
(74) *Attorney, Agent, or Firm*—Thomas F. Lenihan

(57) ABSTRACT

A test and measurement instrument acquires a signal from a device under test, displays that signal as a source waveform, and makes measurements on that source waveform with regard to a predetermined property or event. The test and measurement instrument employs the method of the subject invention for placing these measurements into a waveform and directly correlating a position in the measurement waveform to the same area on the source waveform where they were measured. Specifically, the subject invention displays the correlation of points on a source waveform and a measurement waveform without requiring the use of a common horizontal time scale. In one embodiment of the invention, the measurement waveform is a histogram and a pointer to a given location in the histogram causes identification of corresponding areas in the source waveform.

13 Claims, 4 Drawing Sheets

Fig. 1a
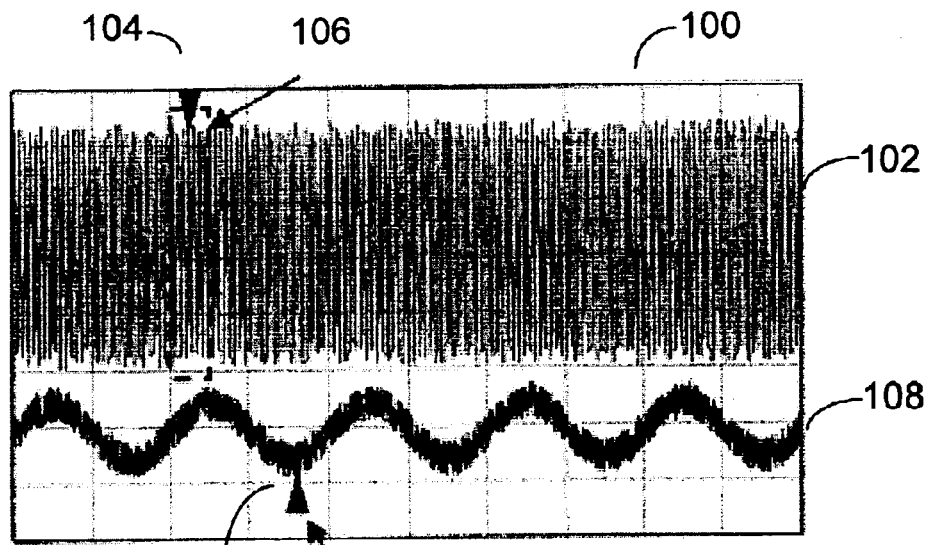
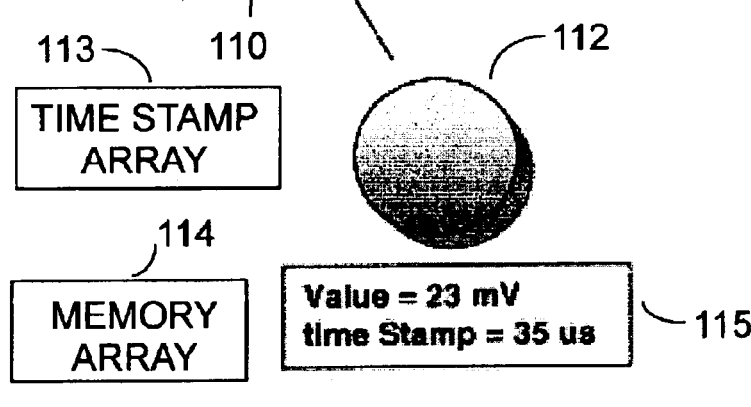
Fig. 1b
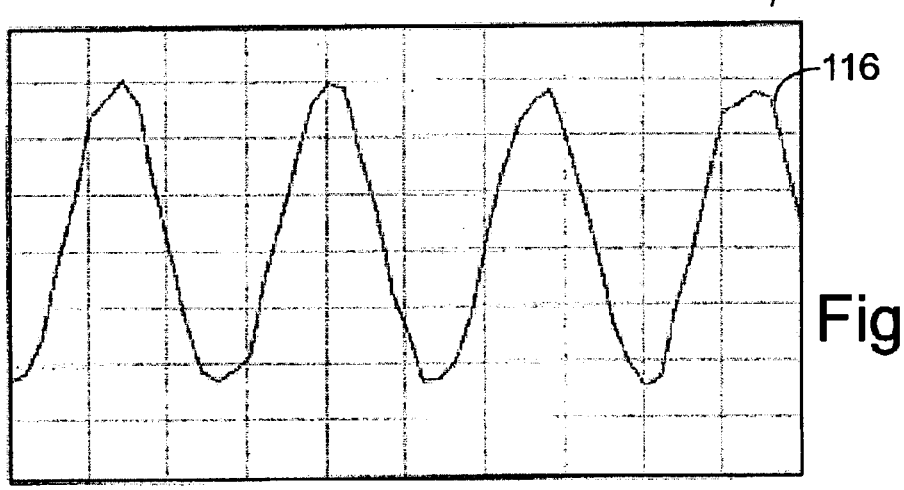
Fig. 1c

METHOD AND APPARATUS FOR VISUALLY TIME-CORRELATING WAVEFORM MEASUREMENTS TO A SOURCE WAVEFORM

CLAIM FOR PRIORITY

The subject application claims priority from U.S. Provisional Patent Application Ser. No. 60/360,194, entitled Method to Visually Time-Correlate Waveform Measurements to a Source Waveform (Ward, et al.), filed 26 Feb. 2002.

FIELD OF THE INVENTION

The subject invention concerns the field of waveform measurement in general, and in particular, it concerns correlation of waveform measurements to source waveforms.

BACKGROUND OF THE INVENTION

Modern digital oscilloscopes include software "packages" tailored to include the features necessary or desirable to perform waveform measurements in specific areas of engineering. For example, a particular software package may include those features best used by communications systems engineers, while another software package may include measurement features more often used by engineers engaged in the design and testing of power supplies.

It is common practice in jitter analysis and disk drive measurement packages to make a series of measurements over a long record waveform that contains many occurrences of the property or event to be measured. It is also common practice to collect and display the list of measurements obtained as a function of horizontal index on a display screen.

For example, the Tektronix TVC 501 Signal Conditioner Plug-in for an oscilloscope, manufactured by Tektronix Inc., Beaverton, Oreg. is listed in the Tektronix 1991 Oscilloscope Catalog, and in the Tektronix 1993 Oscilloscope Catalog. The TVC 501 plug-in caused the display of the measurements taken on an input signal as a waveform as a function of time, and directly correlated the time positions of the measurements to the waveform features that result in the measurement on the source waveform where they were measured.

U.S. Pat. No. 6,195,617 (Miller) issued 27 Feb. 2001, and assigned to LeCroy S. A., also teaches displaying these measurements as a waveform as a function of time and directly correlating their time position to the waveform features that result in the measurement on the source waveform where they were measured.

What is needed is a method of placing these measurements into a measurement waveform, and directly correlating a given position on the measurement waveform to the same area on the source waveform where it was measured, wherein the method does not depend on the use of a common horizontal time scale for the input signal waveform and the measurement waveform.

SUMMARY OF THE INVENTION

A test and measurement instrument acquires a signal from a device under test, displays that signal as a source waveform, and makes measurements on that source waveform with regard to a predetermined property or event. The test and measurement instrument employs the method of the subject invention for placing these measurements into a waveform and directly correlating a position in the measurement waveform to the same area on the source waveform where they were measured. Specifically, the subject invention displays the correlation of points on a source waveform and a measurement waveform without requiring the use of a common horizontal time scale.

In one embodiment of the invention, the measurement waveform is a histogram and a pointer to a given location in the histogram causes identification of corresponding areas in the source waveform.

In another embodiment of the invention, the measurement waveform is displayed with respect to a logarithmic or other non-linear horizontal scale factor. A pointer to a given location on the measurement waveform will cause a corresponding pointer in the source waveform to identify the area of the source waveform from which that measurement was taken.

In yet another embodiment of the invention, a zoom box is centered about a given location in the source waveform corresponding to a given position of a pointer on the measurement waveform, and moves along the source waveform in response to movement of the pointer along the measurement waveform. A display of a zoomed portion of the source waveform allows a user to observe in detail areas of the source waveform corresponding to the measured property or event.

In a still further embodiment of the invention, the measurement waveform need not be displayed. In this embodiment, a cursor (or other marker) is moved along the source waveform, and causes a display readout to display the value of the measurement that was most near to the current position of the cursor.

BRIEF DESCRIPTION OF THE DRAWING

FIGS. 1a and 1c are illustrations showing screen displays generated in accordance with the subject Invention.

FIG. 1b is an illustration showing user-viewable elements useful for interacting with the screen display of FIG. 1a to produce the screen display of FIG. 1c.

DETAILED DESCRIPTION OF THE DRAWING

Figure 2:
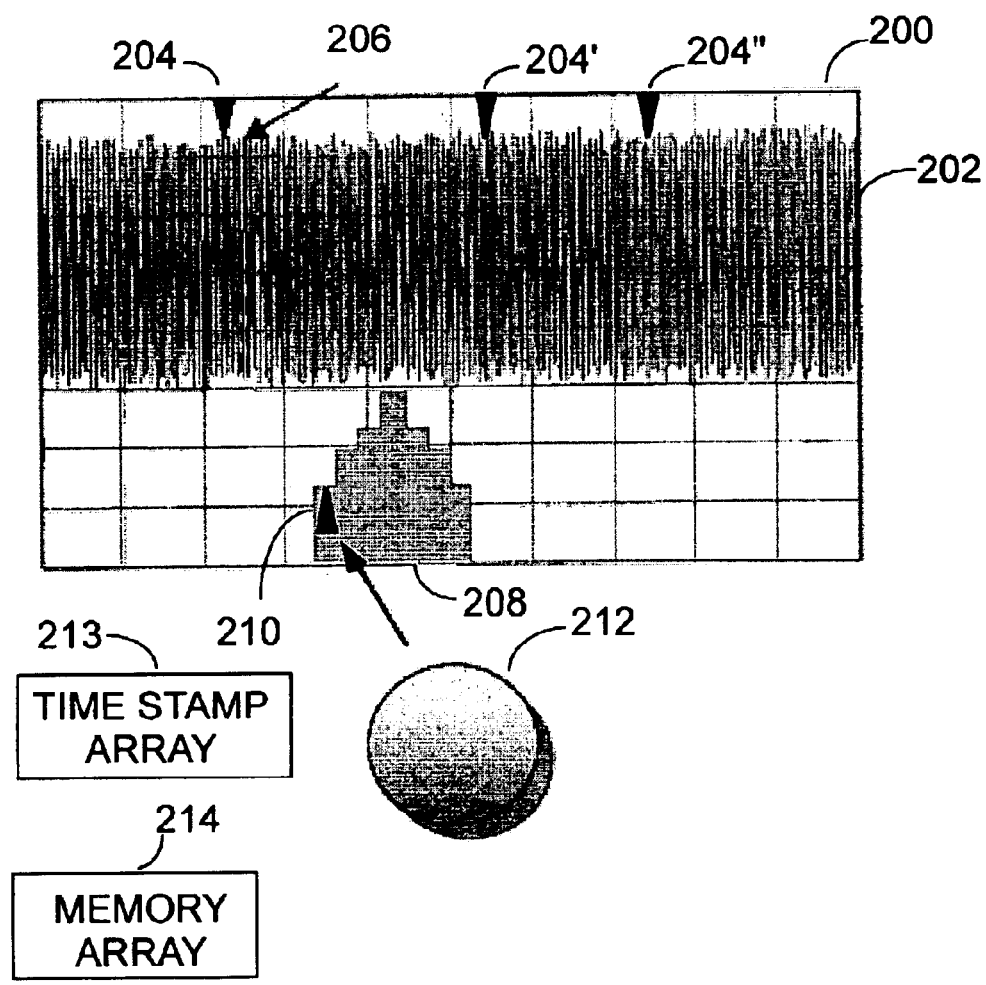
FIGS. 2 and 3 are illustrations showing screen displays generated in accordance with further embodiments of the subject Invention.

The subject invention will be described with reference to FIGS. 1a, 1b, and 1c. A display screen 100 of a digital storage oscilloscope (DSO) is shown displaying an acquired waveform 102. One skilled in the art will understand that waveform 102 has been acquired by the acquisition system of the DSO and processed for display. For purposes of explanation of the subject invention, waveform 102 will be referred to as the "source" waveform.

The waveform record of the acquired source waveform is then examined from beginning to end by a measurement algorithm that searches for occurrences of preselected properties or events. Examples of such properties or events may be, but are not limited to, particular values of pulse widths, amplitudes, periods, etc.

Similar occurrences of these properties or events are noted upon detection. A time index (i.e., time stamp) indicates the position within the source signal of each occurrence of each event is saved to a first memory array known as a Time Stamp Array 113. In practice, the time stamp represents the distance in time from the trigger position to the region in the source waveform where the measurement was made. The measured value at that point is stored in a second Memory Array 114. The measurement values stored in Memory Array 114 are used to create a measurement waveform 108 wherein its vertical scale represents the measurement and its horizontal scale is associated with an index related to time stamps indicating the location in the source waveform where the measurement was made.

A cursor or marker 110 or some other visual indicator may be placed on measurement waveform 108 and controlled via a knob 112 or other user interface (UI) device. A numerical read out 115, preferably on display screen 100, indicates the value of the measurement and the time stamp for the current position of the measurement marker. A second marker or cursor 104, or a visual aid such as color zone, etc. is automatically placed on source waveform 102 at a position determined by the time stamp array for measurement waveform 106. As a user rotates Knob 112 (or operates another kind of UI data entry device) cursor 110 moves through waveform 108 and in response, cursor 104 moves through corresponding locations in waveform 102. Thus, the displayed positions of cursors 104 and 110 on their respective waveforms are correlated in time, and maintain their correlation while tracking the movement of knob 112.

In a further embodiment of the invention, a menu selection causes a display zoom to occur around the region where the measurement was taken. This is accomplished as follows. Display 100 of FIG. 1c, shows a zoomed version 116 of source waveform 102 in the region of the source waveform where that measurement was made. That is, a zoom box 106 is centered at the position of marker 104 on source waveform 102. That is, the position of marker 104 corresponds to the horizontal center of the window displaying zoomed view 116. As a user moves marker 110 on measurement waveform 108, the corresponding marker 104 and zoom box 106 on source waveform 102 track and follow the movement of marker 110.

In another embodiment, the measured values are saved into a histogram waveform 208, as shown in FIG. 2. Those elements of FIG. 2 that bear similar reference numerals to those of FIGS. 1a, 1b, and 1c serve substantially the same purpose and need not be described in detail again.

Histogram waveform 208 can be, for example, a graph of the frequency of occurrence of peak amplitude values of source waveform 202. The vertical scale of histogram 208 is expressed in terms of frequency of occurrence (i.e., number of hits), whereas the horizontal scale of histogram 208 is expressed in units of signal amplitude. In the example of FIG. 2, the histogram comprises seven "bins" of differing heights arranged from left to right. The center bin represents those sampled peak amplitude values having the highest frequency of occurrence, in this case a nominal peak value. The leftmost bin represents the total number of sampled peak values having the least amplitude with respect to the nominal peak value. The rightmost bin represents the total number of sampled peak values having the greatest amplitude value with respect to the nominal peak value.

As the peak amplitude values are accumulated into a histogram database in Memory Array 214, their corresponding Time Stamps are saved in Time Stamp Array 213. A cursor or marker 210 or some other visual indicator may be placed on histogram 208 and controlled via a knob 212 or other user interface (UI) device.

A series of markers or cursors 204, 204', 204" or a visual aid such as color zone, etc. is automatically placed on source waveform 202 at positions determined by the time stamp array 213 for histogram 208. As a user rotates Knob 212 (or operates another kind of UI data entry device) cursor 210 moves through the bins of histogram 208. In response, cursors 204, 204', 204" indicate corresponding locations in waveform 202 that exhibiting the amplitude represented by the particular bin in which cursor 210 is currently found. Thus, the displayed positions of cursors 204, 204', 204" and 210 on the source waveform and histogram, respectively, are correlated. It is important to note that the cursors maintain their correlation while tracking the movement of knob 212, even though source waveform 202 and histogram 208 do not share a common horizontal measurement scale. As noted above, displacement along the horizontal axis of source waveform 202 is measured in time increments, whereas displacement along the horizontal axis of histogram 208 is measured in terms of amplitude bins.

Figure 3:
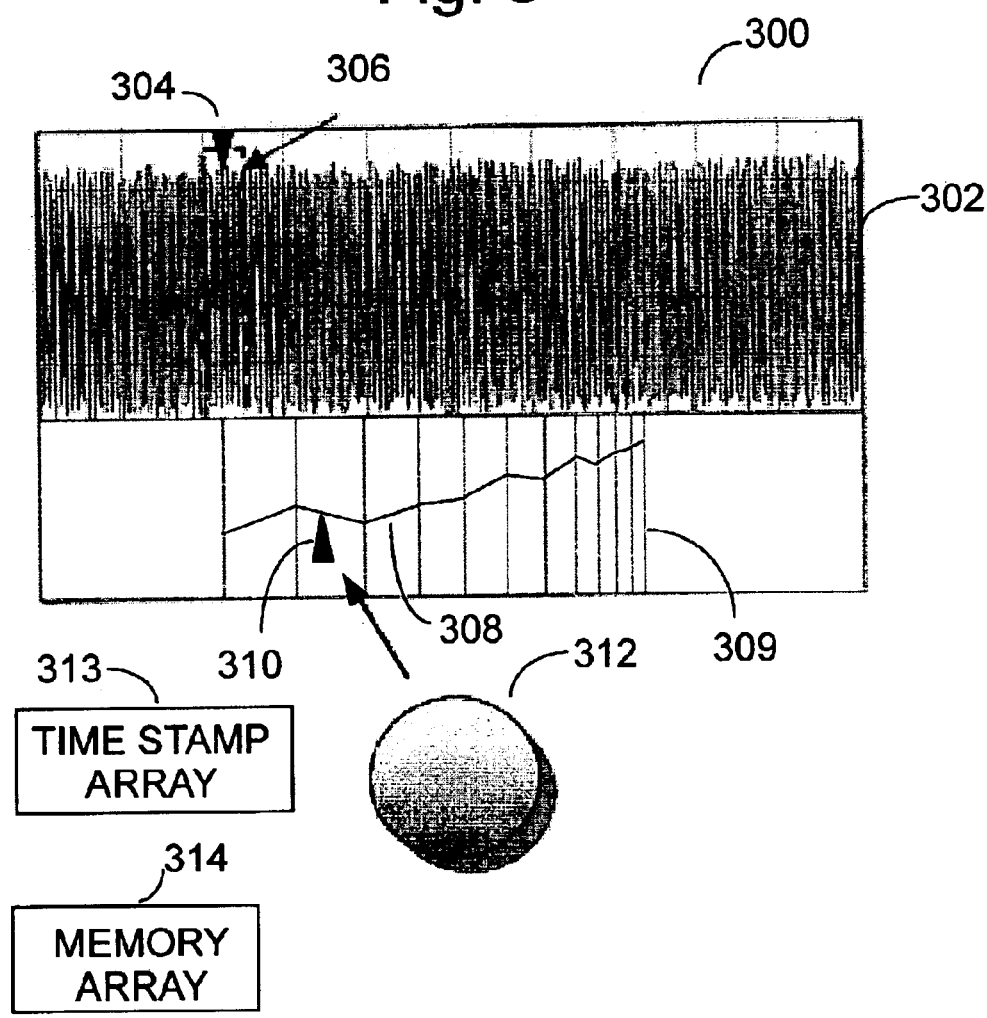

In a further embodiment, the measured values are saved into a waveform 308 that is displayed on a non-linear horizontal axis, as shown in FIG. 3. Those elements of FIG. 3 that bear similar reference numerals to those of FIGS. 1a, 1b, and 1c serve substantially the same purpose and need not be described in detail again.

Waveform 308 can be, for example, a graph of an upward drift in frequency of source waveform 302 over a relatively long period of time. The vertical scale of waveform 308 is expressed in terms of frequency, whereas the horizontal scale of waveform 308 is expressed in non-linear (e.g., logarithmic) units of time.

As duty cycle-indicative, or period-indicative, values of waveform 302 (or other values from which frequency can be determined) are accumulated into a waveform database in Memory Array 314, their corresponding Time Stamps are saved in Time Stamp Array 313. A cursor or marker 310 or some other visual indicator may be placed on waveform 308 and controlled via a knob 312 or other user interface (UI) device.

A marker or cursor 304 or a visual aid such as color zone, etc. is automatically placed on source waveform 302 at positions determined by time stamp array 313 for waveform 308. As a user rotates Knob 312 (or operates another kind of UI data entry device) cursor 310 moves through waveform 308. In response, cursor 304 indicates a corresponding location in waveform 302 from which that particular measurement was made. Thus, the displayed position of cursors 304 and 310 on the source waveform and measurement waveform, respectively, are correlated. It is important to note that the cursors maintain their correlation while tracking the movement of knob 312, even though source waveform 302 and measurement waveform 308 do not share a common horizontal measurement scale. As noted above, displacement along the horizontal axis of source waveform 202 is measured in linear time increments, whereas displacement along the horizontal axis of waveform 308 is measured in terms non-linear time increments.

Figure 4:
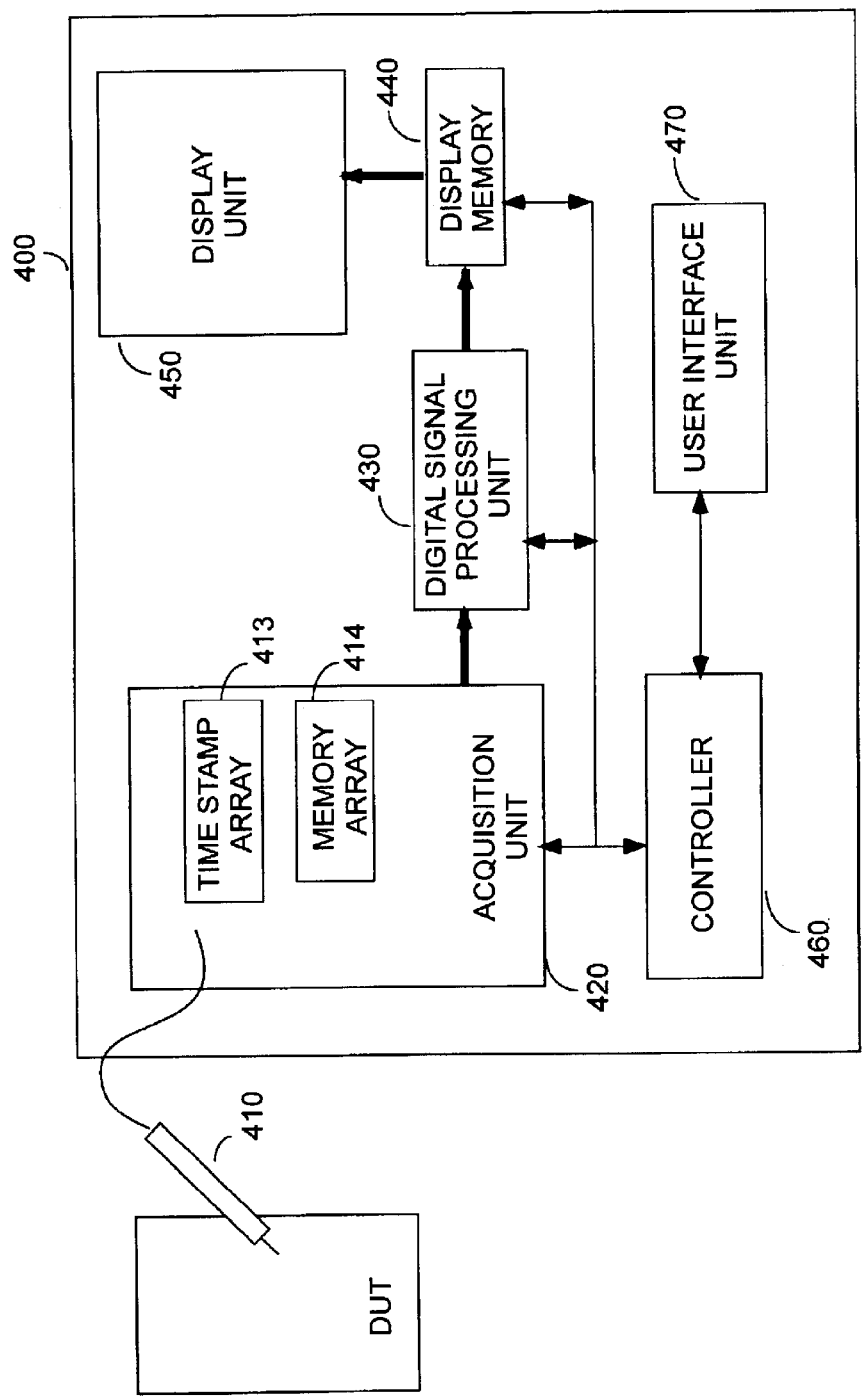
FIG. 4 shows a high-level block diagram of a digital storage oscilloscope suitable for use with the subject invention.

FIG. 4 shows a high-level block diagram of a digital storage oscilloscope (DSO) 400 suitable for use with the subject invention. A probe 410 acquires signals from a device under test (DUT), and applies the signals to an Acquisition Unit 420 which digitizes the signals and stores a digital representation of the amplitude of each sample in a first memory array 414. Acquisition Unit 420 also stores a corresponding time stamp value for each sample in a second memory array known as a time stamp array 413. DSO 400 also includes a Digital Signal Processing portion (DSP) 430 for processing the acquired signal samples and applying the processed signal samples to a Display Memory 440 for ultimate display on a Display Unit 450.

A controller 460 controls Acquisition Unit 420, Digital Signal Processing portion (DSP) 430, Display Memory 440, and Display Unit 450 in response to its own control program and in response to user input via a User Interface unit 470. User Interface unit 470 may include knob 112, 212, 312 and other user-operable input devices.

One skilled in the art will recognize that the zoom feature described above with respect to FIG. 1c, can also be applied to the embodiments shown in FIGS. 2 and 3.

The use of the word "or" in the following claims is intended to convey the meaning of "inclusive-or", that is, one or the other, or both.

Although the invention has been described with respect tro an oscilloscope, it is not intended to be so limited. One skilled in the art will realize that the subject invention may be used in other test and measurement instruments such as logic analyzers.

What is claimed is:

1. A test and measurement instrument, comprising:
   an acquisition unit for acquiring samples of a signal from a device under test;
   a first memory for storing said signal samples;
   a second memory for storing a timestamp associated with said signal samples;
   a digital signal processing unit for processing said signal samples to produce a source waveform for display; and
   a controller for controlling said acquisition unit, said digital signal processing unit, and said display unit;
   wherein, said digital signal processing unit performs measurements on said source waveform with regard to a predetermined property or event;
   said digital signal processing unit using said measurements to produce a measurement waveform for display;
   said controller causing said display to display first and second indicia correlating a position in said measurement waveform to an area on said source waveform where said measurement was taken;
   said correlation being performed in response to said stored signal samples and said stored time stamps;
   said correlation being performed when said source waveform and said measurement waveform share a common horizontal time axis, or when said source waveform and said measurement waveform do not share a common horizontal time axis.

2. The test and measurement instrument of claim 1, wherein
   a zoom box is centered about a given location in said source waveform corresponding to a given position of an indicator on said measurement waveform, and said zoom box moves along said source waveform in response to movement of said pointer along said measurement waveform; and
   a display of a zoomed portion of said source waveform shows in detail an area of said source waveform corresponding to said measured property or event.

3. The test and measurement instrument of claim 1, wherein
   said source waveform and said measurement waveform do not share a common horizontal time axis; and
   an indicator to a given location in said measurement waveform causes an area corresponding to said given waveform measurement location to be identified in said source waveform.

4. The test and measurement instrument of claim 3, wherein
   said indicator to said given location in said measurement waveform is a pointer, a cursor, or a change of color of said waveform at said given location.

5. The test and measurement instrument of claim 1, wherein
   said source waveform and said measurement waveform do not share a common horizontal time axis; and
   said measurement waveform is a histogram; and
   an indicator to a given location in said histogram causes those areas corresponding to said given histogram location to be identified in said source waveform.

6. The test and measurement instrument of claim 5, wherein
   said indicator to said given location in said histogram is a pointer, a cursor, or a change of color of said histogram at said given location.

7. The test and measurement instrument of claim 6, further comprising:
   a user-operable control for moving said display of said indicator in said histogram from a first position to a second position; and
   said movement of said histogram indicator to said second location in said histogram causes those areas corresponding to said second histogram indicator location to be identified in said source waveform.

8. The test and measurement instrument of claim 1, wherein
   said source waveform and said measurement waveform do not share a common horizontal time axis; and
   said measurement waveform is displayed with respect to a non-linear horizontal scale factor.

9. The test and measurement instrument of claim 8, wherein
   said indicator to said given location in said measurement waveform is a pointer, a cursor, or a change of color of said waveform at said given location.

10. The test and measurement instrument of claim 9, wherein
    An indicator to a given location on said measurement waveform causes a corresponding indicator in the source waveform to identify an area of said source waveform from which said measurement was taken.

11. The test and measurement instrument of claim 10, wherein
    a zoom box is centered about a given location in said source waveform corresponding to a given position of said indicator on said measurement waveform, and said zoom box moves along said source waveform in response to movement of said pointer along said measurement waveform; and
    a display of a zoomed portion of said source waveform shows in detail an area of said source waveform corresponding to said measured property or event.

12. A test and measurement instrument, comprising:
    an acquisition unit for acquiring samples of a signal from a device under test;
    a first memory for storing said signal samples;
    a second memory for storing a timestamp associated with said signal samples;
    a digital signal processing unit for processing said signal samples to produce a source waveform for display; and
    a controller for controlling said acquisition unit, said digital signal processing unit, and said display unit;

wherein, said digital signal processing unit performs measurements on said source waveform with regard to a predetermined property or event;

said controller causing display of an indicator identifying a position in said source waveform;

a correlation being performed between said signal samples of source waveform at said indicated location and measurement data relating to said indicated location, and displaying a value of said related data on said display device;

said correlation being performed when said source waveform and said measurement data are related to a common horizontal time axis, or when said source waveform and said measurement data are not related to a common horizontal time axis.

13. A method for correlating a source waveform and a measurement waveform, comprising the steps of:

acquiring samples of a signal from a device under test;

storing said signal samples in a first memory;

storing a timestamp related to said signal samples in a second memory;

processing said signal samples to produce a source waveform for display;

performing measurements on said source waveform with regard to a predetermined property or event;

using said measurements to produce a measurement waveform for display; and displaying first and second indicia correlating a position in said measurement waveform to an area on said source waveform where said measurement was taken;

said correlation being performed when said source waveform and said measurement waveform share a common horizontal time axis, or when said source waveform and said measurement waveform do not share a common horizontal time axis.

\* \* \* \* \*